US005585303A

United States Patent [19]
Hong et al.

[11] Patent Number: 5,585,303
[45] Date of Patent: Dec. 17, 1996

[54] METHOD FOR MANUFACTURING A STACKED/TRENCH DRAM CAPACITOR

[75] Inventors: Gary Hong, Hsinchu; J. S. Jason Jenq, Ping-Tung, both of Taiwan

[73] Assignee: United Microelectronics Corporation, Hsinchu, Taiwan

[21] Appl. No.: 608,104

[22] Filed: Feb. 28, 1996

[51] Int. Cl.$^6$ .................................. H01L 21/8242
[52] U.S. Cl. ........................ 437/60; 437/203; 437/919
[58] Field of Search ....................... 437/52, 60, 190, 437/203, 919; 148/DIG. 50

[56] References Cited

U.S. PATENT DOCUMENTS

| | | | |
|---|---|---|---|
| 5,066,608 | 11/1991 | Kim et al. | 437/60 |
| 5,234,856 | 8/1993 | Gonzalez | 437/203 |
| 5,411,911 | 5/1995 | Ikeda et al. | 437/203 |
| 5,521,111 | 5/1996 | Sato | 437/60 |

*Primary Examiner*—Chandra Chaudhari
*Attorney, Agent, or Firm*—Townsend and Townsend and Crew

[57] ABSTRACT

A method for manufacturing a DRAM capacitor on a substrate in which an insulator, a first barrier layer, a first conductive layer and a second barrier layer are sequentially applied over the gate electrode and source/drain areas of the substrate. Portions of the deposited layers above the source/drain areas are removed to form trenches which reach these areas. After portions of the second barrier layer and the first conductive layer are etched away, a conductive material layer is deposited thereover, an n-type dopant is doped into the conductive material layer, the dopant is diffused into the substrate to form n$^+$-type diffused regions, and the conductive material layer is shaped to form spaced-apart poly spacers and poly fins. Thereafter the first and the second barrier layers are removed to form a bottom plate of the DRAM capacitor which is defined by the first conductive layer, the poly spacers and the poly fins. Finally, a dielectric film is applied over the bottom plate and a further conductive layer is deposited thereover so that it forms a top plate of the DRAM capacitor. The resulting stack/trench capacitor has a larger dielectric film area and a correspondingly larger capacitance.

11 Claims, 8 Drawing Sheets

METHOD FOR MANUFACTURING A STACKED/TRENCH DRAM CAPACITOR

BACKGROUND OF THE INVENTION

1. Field of the Invention

The present invention relates to a method for manufacturing DRAM (Dynamic Random Access Memory) units, and relates in particular to a method for manufacturing a capacitor of a DRAM unit. More particularly, the present invention relates to a method which is capable of manufacturing a capacitor of a DRAM unit having an increased area.

2. Description of Prior Art

DRAMs have been widely used for a long time to temporally store data. Generally, a DRAM cell includes a MOS transistor 10 and a capacitor 12 as shown in FIG. 1. Further, the gate of the MOS transistor 10 is connected to the word line WL, and the drain and the source of the MOS transistor 10 are respectively connected to the bit line BL and grounded via the capacitor 12. However, the capacitor 12 should have a high capacitance to avoid a loss of data.

FIG. 2 schematically illustrates in cross-section a conventional DRAM cell, in which the reference number 2 represents the substrate; the reference number 20 represents the field oxide; the reference number 22 indicates the conductive lines; the reference number 24 represents the insulators; the reference number 30 represents the doped regions of the substrate, i.e., the source and the drain of the MOS transistor of the DRAM cell; the reference number 32 represents the gate of the MOS transistor; and the reference numbers 34, 36, 38 respectively represent the lower conductive layer, the dielectric layer and the upper conductive layer of the capacitor of the DRAM cell. The capacitance of the capacitor 12 is dependent on the dielectric constant, the thickness and the area of the dielectric layer. A larger area of the capacitor will result in a larger capacitance of the capacitor. However, as integrated circuits are fabricated with higher densities and smaller surfaces, this portion of the DRAM increasingly suffers from the drawback of a smaller capacitance.

SUMMARY OF THE INVENTION

It is therefore an object of the present invention to provide an improved technique which overcomes the drawbacks and disadvantages associated with the forementioned DRAM cells.

Another object of the present invention is to extend poly fins, spacers, and a bottom electrode surface to increase the capacitance of the DRAM capacitor.

The present invention achieves the above-indicated objectives by providing a method for manufacturing a stacked/trench DRAM capacitor. The method includes the steps of:

depositing an insulator, such as silicon dioxide, over the gate electrode and source/drain areas, then depositing a first barrier layer, such as silicon nitride, on top of the silicon dioxide layer;

depositing respectively a first conductive layer and a second barrier layer over the previous nitride layer;

etching away the insulator, the first barrier layer, the first conductive layer and the second barrier layer above the source/drain regions beside the field oxide to form trenches reaching the source/drain regions;

patterning a first layer of resist on the top of the surface to define the region of the first conductive layer, then etching away the second barrier layer and the first conductive layer that are not covered by the resist layer to form sidewalls defined by the second barrier layer and the first conductive layer;

removing the first layer of resist;

depositing a layer of polysilicon over the resulting top surface, heavily doping an n-type dopant into the polysilicon layer, and then diffusing the $n^+$ dopant into the substrate to form $n^+$-type diffused regions;

patterning a second layer of resist on the polysilicon layer to define the polysilicon layer as a second conductive layer;

etching the polysilicon layer to build spaced-apart poly fins and pairs of poly spacers which form a second conductive layer;

etching the first barrier layer and the second barrier layer isotropically and shorting the first conductive layer and the second conductive layer to thereby form a bottom plate of the DRAM capacitor;

depositing a thin layer of a dielectric film on the surface of the bottom plate, then depositing a third conductive layer thereover; and patterning a third layer of resist on the top of the third conductive layer and etching the third conductive layer so that it functions as a top plate of the DRAM capacitor.

As a result, the poly fins, poly spacers and the trenches provide the DRAM capacitor with a significantly larger area, resulting in a correspondingly larger capacitance.

Various other objects, advantages and features of the present invention will become readily apparent from the ensuing detailed description, and the novel features will be particularly pointed out in the appended claims.

BRIEF DESCRIPTION OF THE DRAWINGS

The following detailed description, given by way of example and not intended to limit the invention solely to the embodiments described herein, will best be understood in conjunction with the accompanying drawings in which.

DESCRIPTION OF THE PREFERRED EMBODIMENTS

Figure 1:
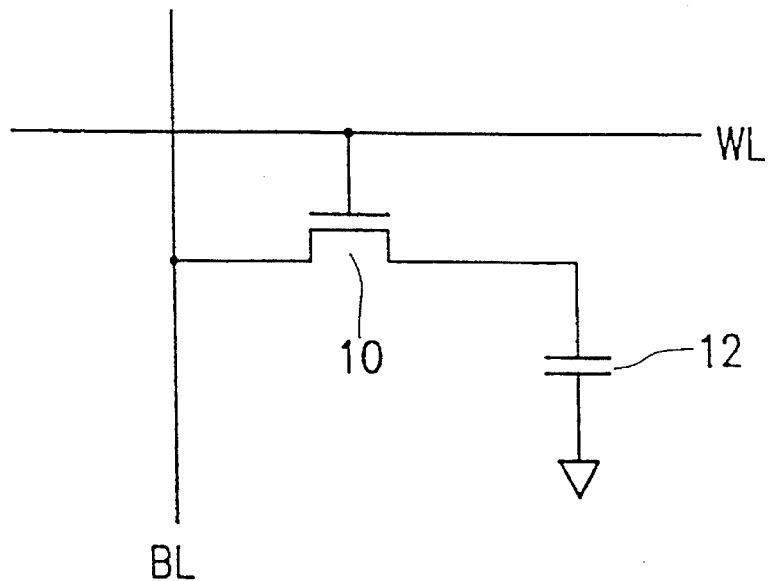
FIG. 1 is a circuit diagram of a DRAM cell.
Figure 2:
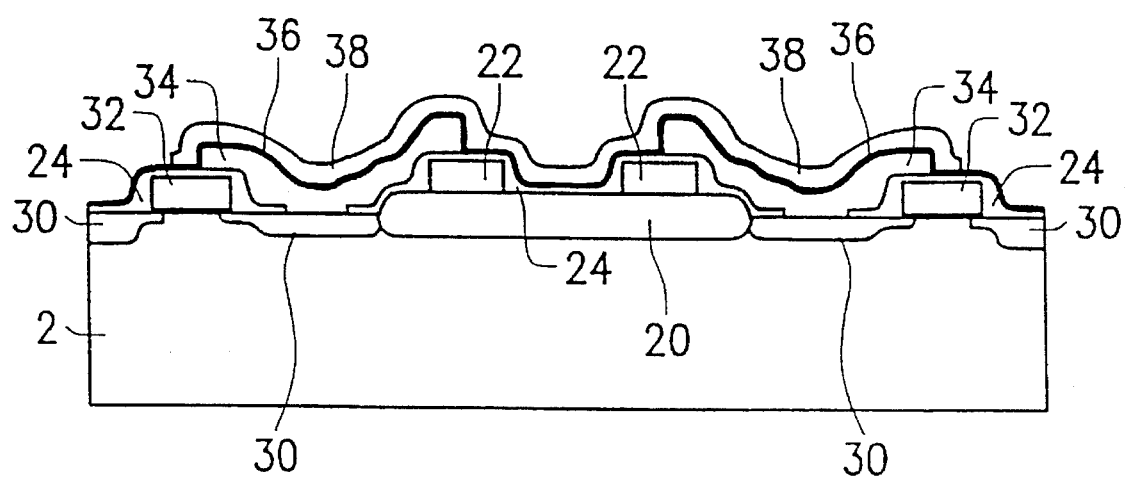
FIG. 2 schematically illustrates a cross-sectional diagram of a conventional DRAM cell.
Figure 3:
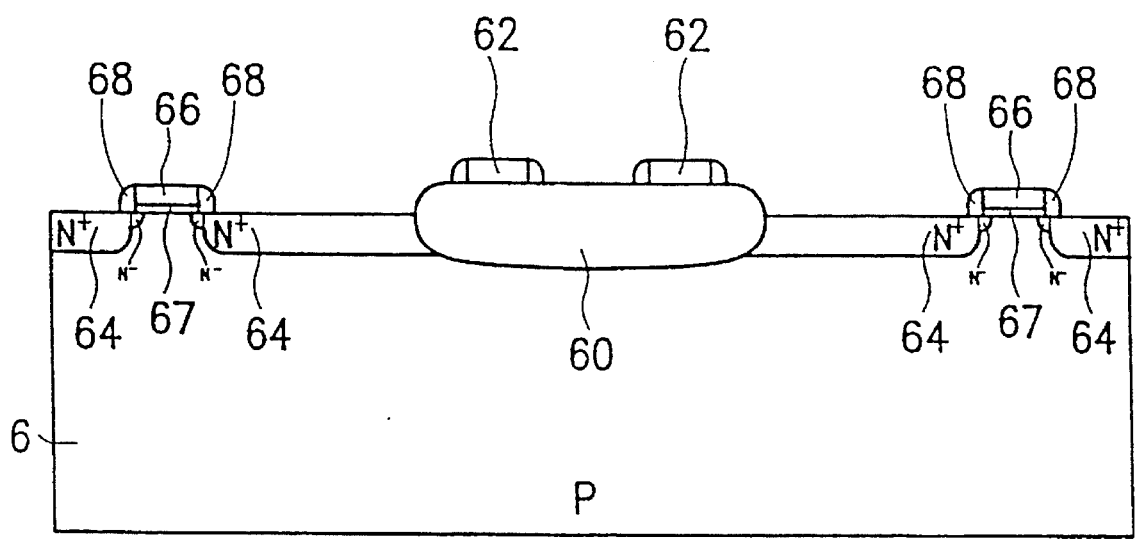
FIG. 3 schematically illustrates a cross-sectional diagram of a substrate having a field oxide and a transistor fabricated thereon.

Referring to FIG. 3, the present invention manufactures a stacked/trench DRAM capacitor on a substrate 6. A field oxide 60 and a transistor device having a gate electrode 66 and $n^+$ source/drain areas 64 are conventionally formed in the silicon substrate 6. In addition, the reference number 62 represents conductive lines, the reference number 67 represents the gate oxides of the MOS transistors, and the reference number 68 represents sidewall spacers. The manufacturing method comprises the following steps:

STEP 1

Figure 4A:
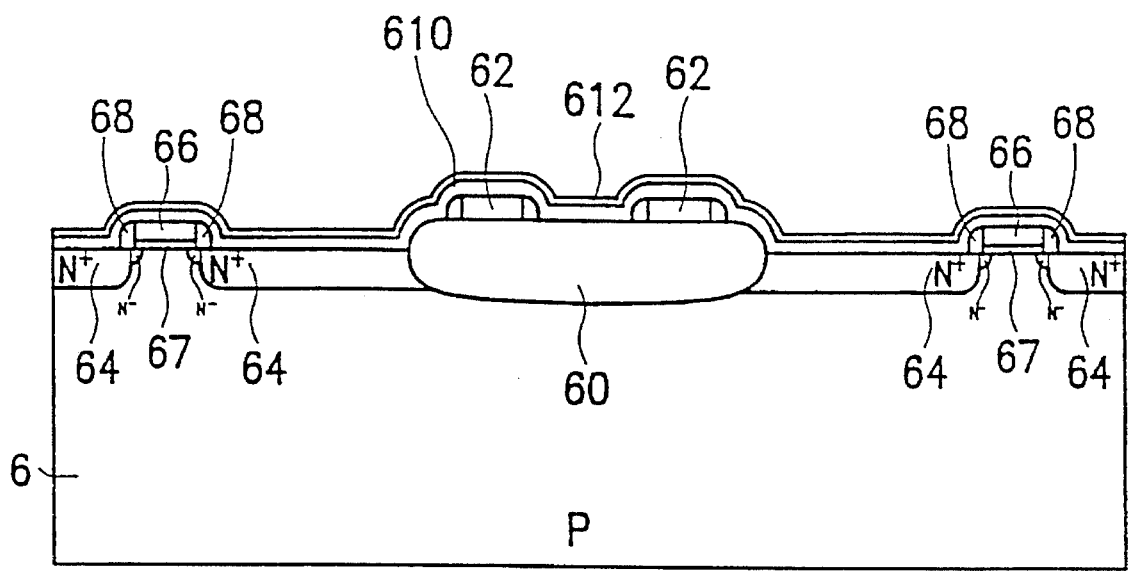
FIGS. 4a–4k are the cross-sectional diagrams which illustrate the DRAM manufacturing process of the present invention.

Referring to FIG. 4a, an insulator 610, such as a layer of silicon dioxide having a thickness of about 1–3 kÅ, is deposited over the gate electrode and source/drain areas, preferably by chemical vapor deposition (CVD). A first barrier layer 612, such as a thin layer of silicon nitride having a thickness of about 1–2 kÅ, is then deposited on the top of the silicon dioxide layer.

STEP 2

Figure 4B:
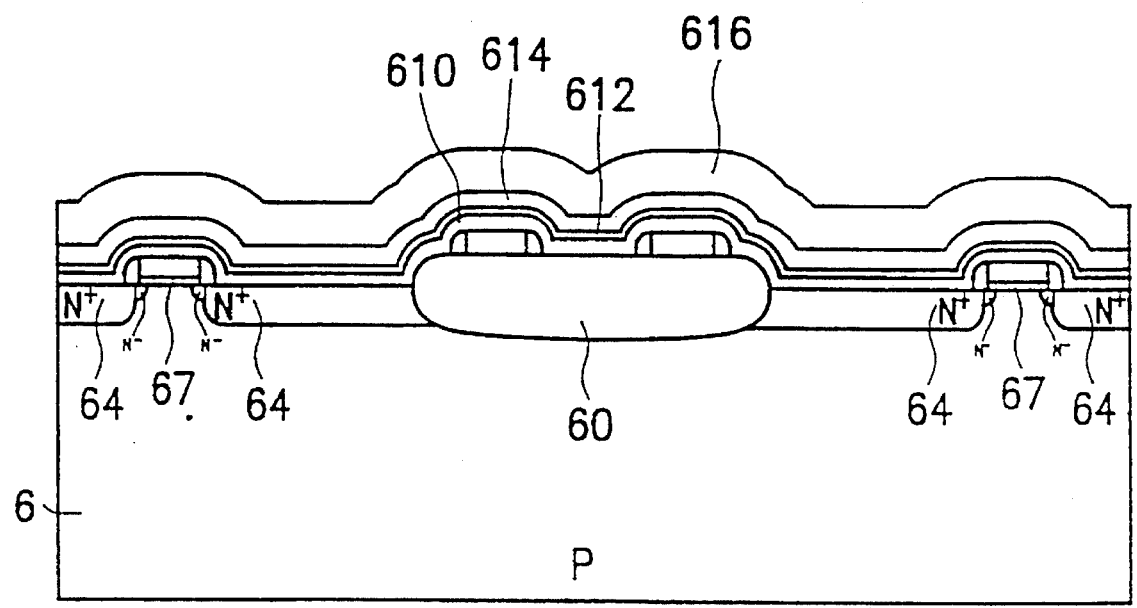

Referring to FIG. 4b, a first conductive layer 614, such as a layer of doped polysilicon having a thickness of about 1–2 kÅ, and a second barrier layer 616, such as a layer of silicon nitride having a thickness of about 2–4 kÅ, are deposited over the previously applied nitride layer.

STEP 3

Figure 4C:
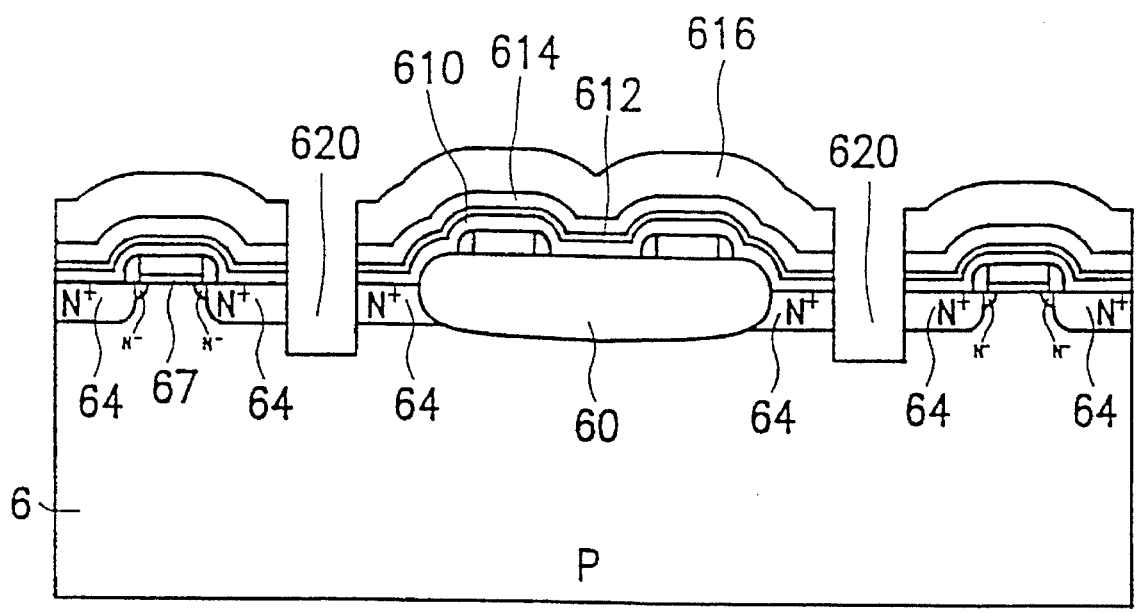

Referring to FIG. 4c, the insulator 610, the first barrier layer 612, the first conductive layer 614 and the second barrier layer 616 are dry etched in the area above the source/drain regions 64 to the side of field oxide 60 to form trenches 620 which extend through the layers and the insulator and which reach the source/drain regions 64.

STEP 4

Figure 4D:
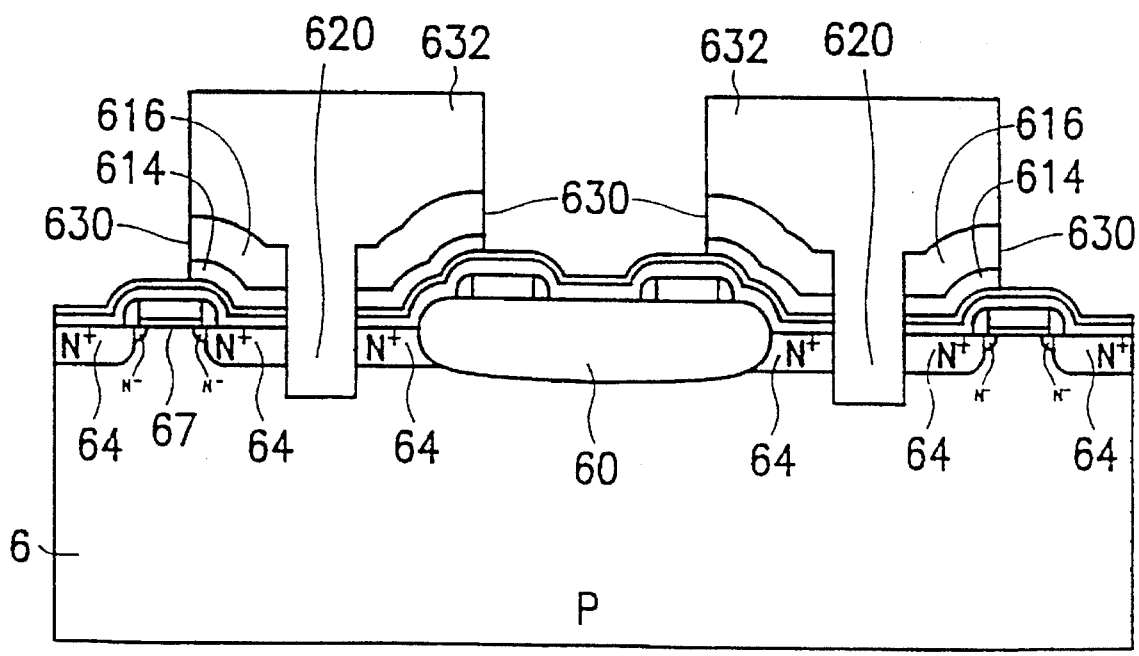

Referring to FIG. 4d, a first layer of resist 632 is next patterned on the top of the surface of the second barrier 616 to define the region of the first conductive layer 614 that is to be retained. The portions of the second barrier layer 616 and the first conductive layer 614 which are not covered by the resist layer 632 are etched away; for example, by plasma etching. Sidewalls 630 defined by the second barrier layer 616 and the first conductive layer 614 are thereby formed. Thereafter, the first layer of resist 632 is removed.

STEP 5

Figure 4E:
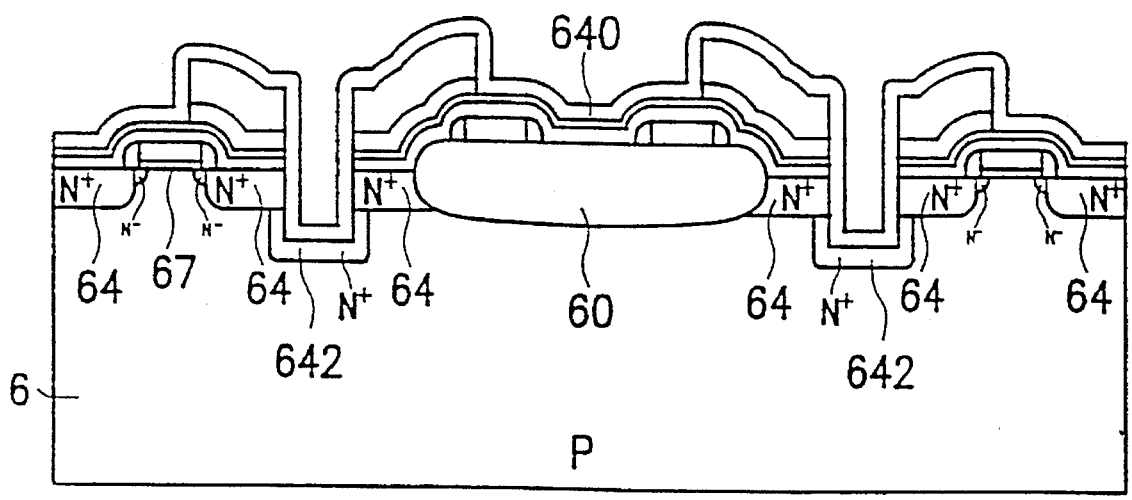

Referring to FIG. 4e, a polysilicon layer 640 is deposited on the remaining top surface and heavily doped with an n-type dopant, for example, implanted As with a dose of about $6E15/cm^2$ at an energy level of about 60 KeV. The $n^+$ dopant is also diffused into the substrate 6 to form $n^+$-type diffused regions 642.

STEP 6

Figure 4F:
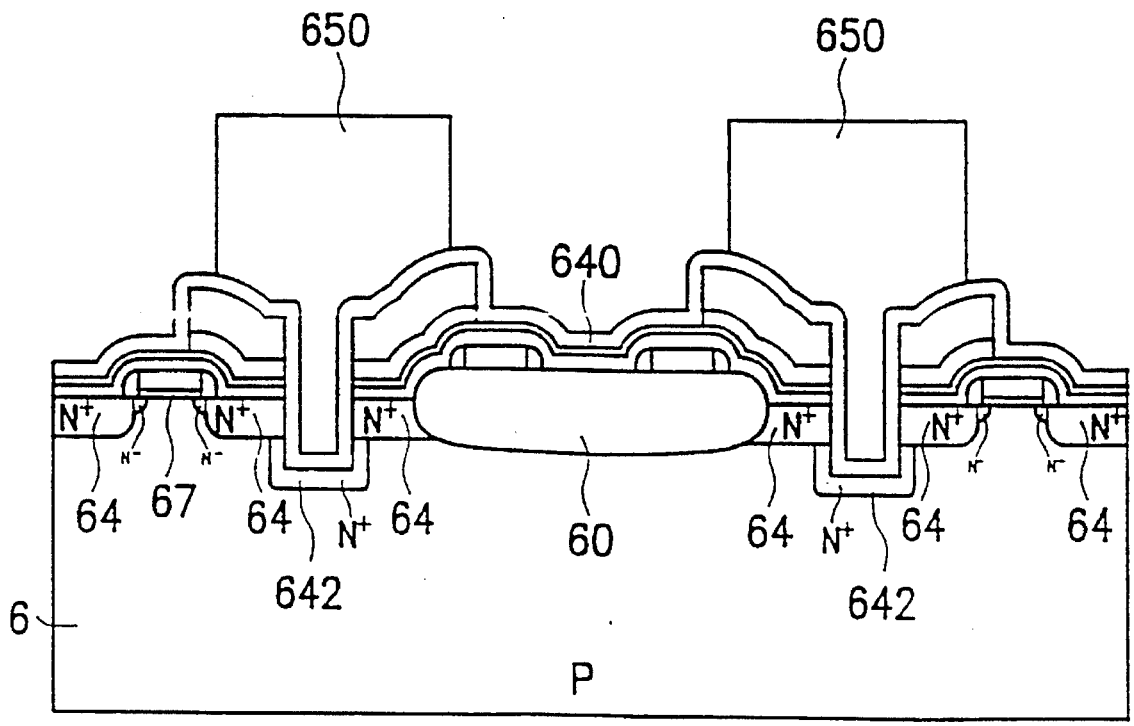

Referring to FIG. 4f, a second layer of resist 650 is patterned on the polysilicon layer 640 to define the portions of the polysilicon layer that are to be retained to later form poly fins 660 and poly spacers 662 (shown in FIG. 4g).

STEP 7

Figure 4G:
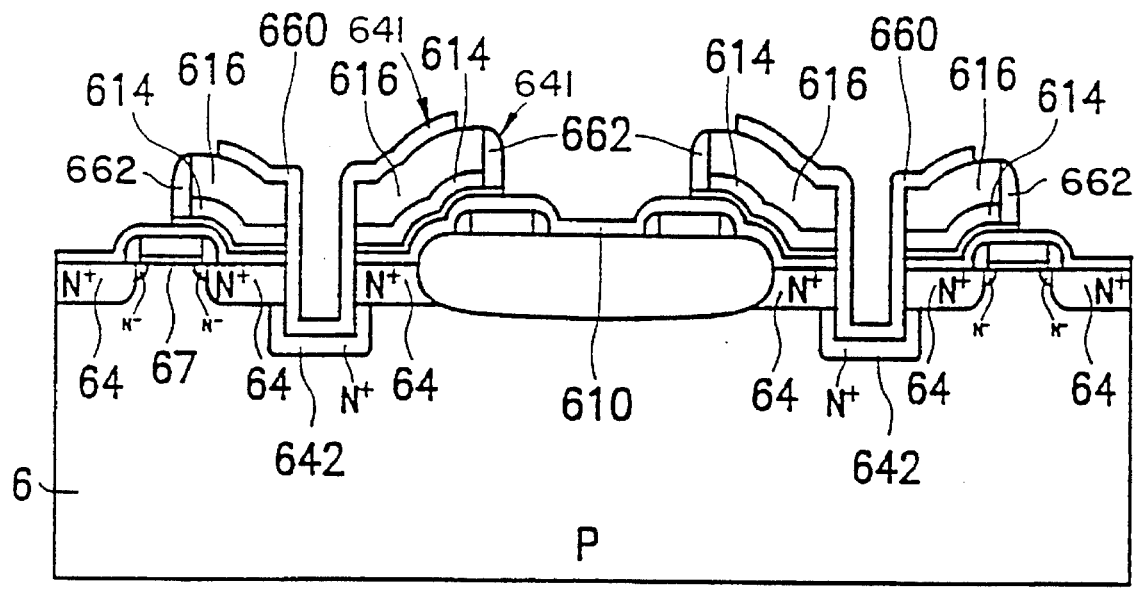

Referring to FIG. 4g, the polysilicon layer 640 is next etched; for example, by plasma etching, to build spaced-apart first and second poly fins 660 and spaced-apart pairs of poly spacers 662 which together define a second conductive layer 641. The plasma etching can be performed, for example, in P-5000 (Applied Materials) under the conditions of 70 sccm $Cl_2$, 80 mTorr, and 200 W.

STEP 8

Figure 4H:
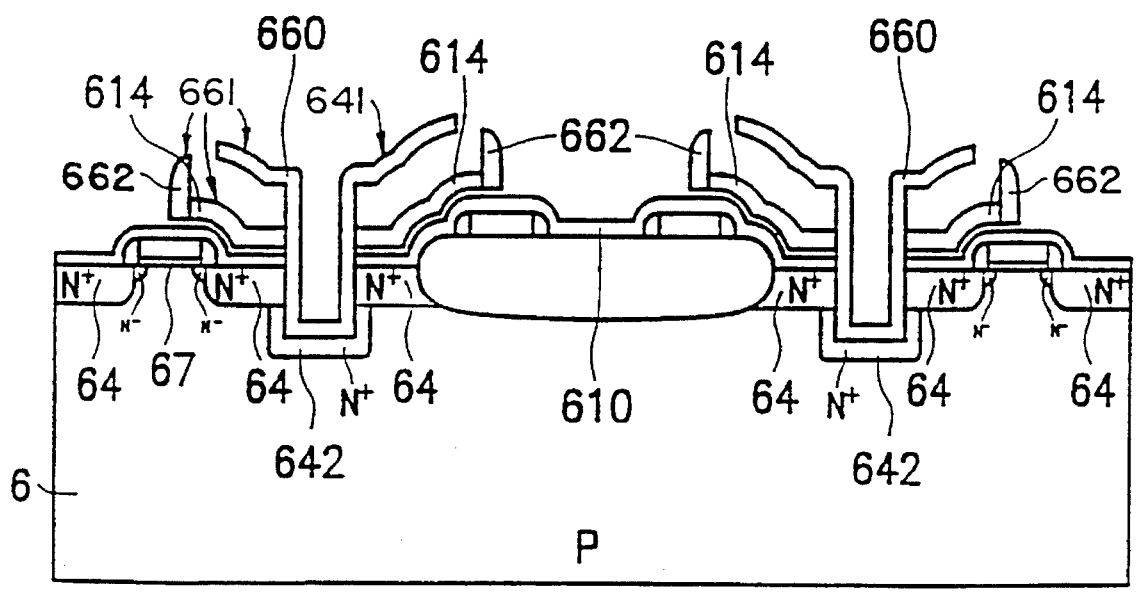

Referring to FIG. 4h, the first and second barrier layers 612, 616 are next isotropically etched; for example, with phosphoric acid ($H_3PO_4$). The first conductive layer 614, the poly fins 660 and poly spacers 662 are shorted together and form a bottom plate 661 of the DRAM capacitor. This wet etching can be stopped on the top surface of the insulator 610 due to the high selectivity of oxide/nitride.

STEP 9

Figure 4I:
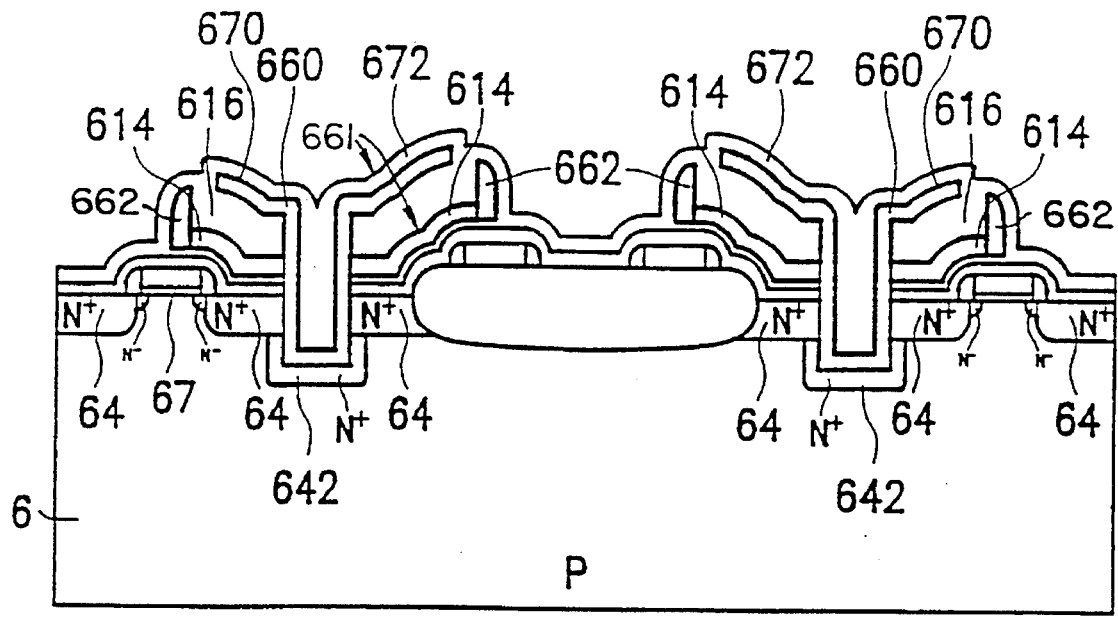

Referring to FIG. 4i, a thin layer of dielectric film 670, such as nitride/oxide (NO film) or oxide/nitride/oxide (ONO film), is deposited over the surface of bottom plate 661. Thereafter a third conductive layer 672, such as a layer of doped polysilicon, is deposited over the film.

STEP 10

Figure 4J:
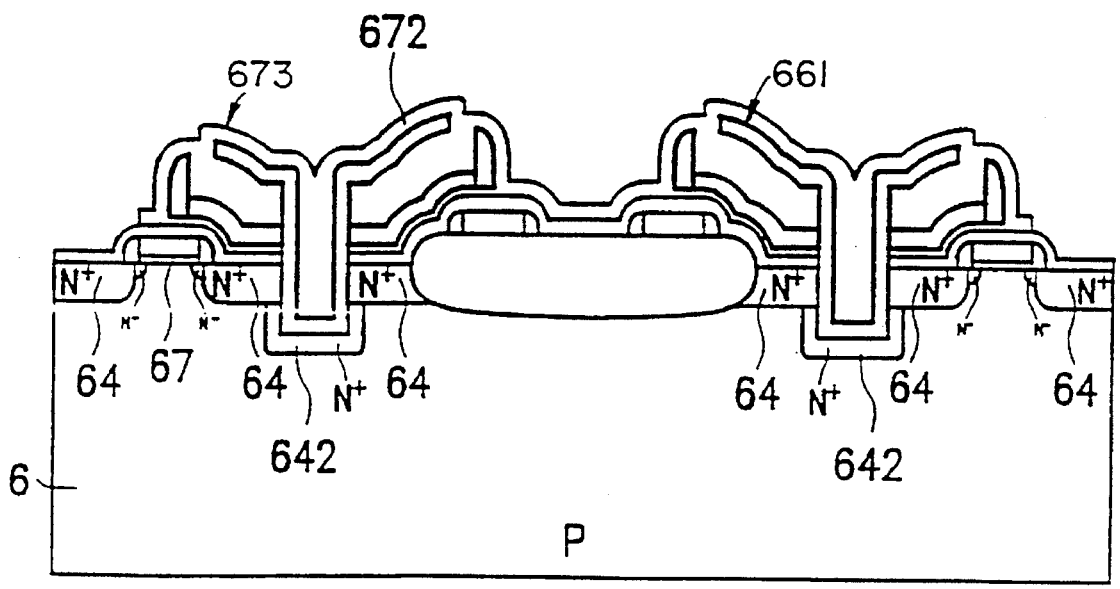

Referring to FIG. 4j, a third layer of resist is patterned on the top of the third conductive layer 672. The third conductive layer 672 is etched by the conventional etching condition. The third conductive layer 672 functions as a top plate 673 of the DRAM capacitor.

STEP 11

Figure 4K:
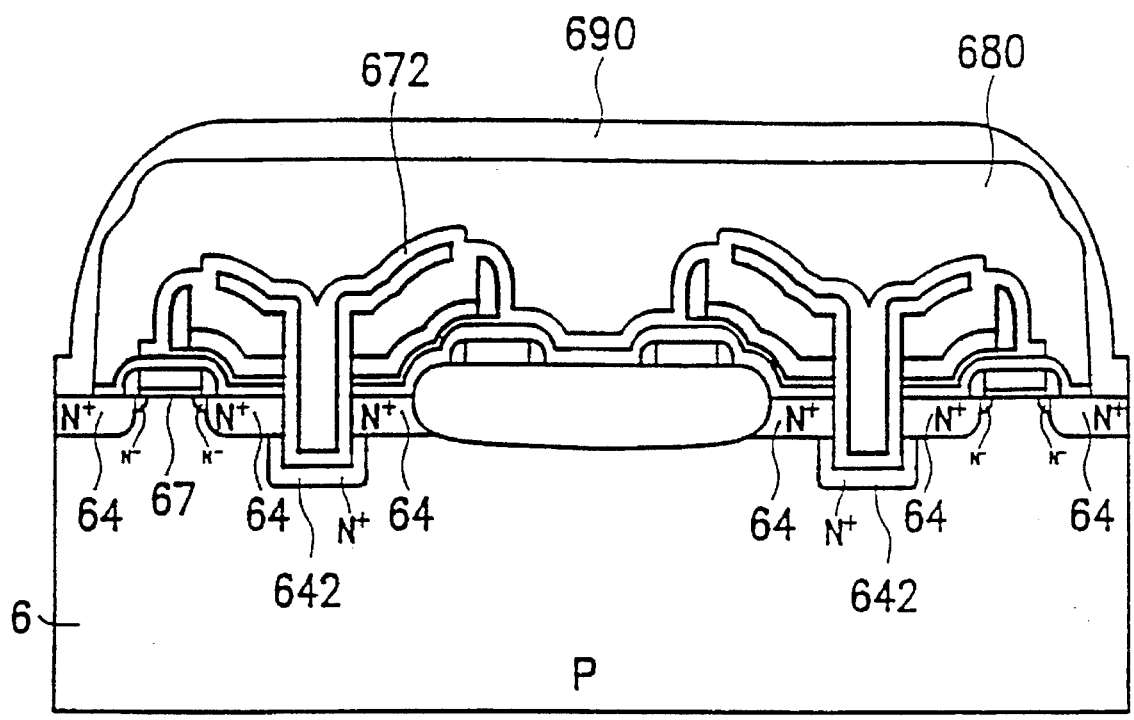

Referring to FIG. 4k, thereafter conventional back-end processes such as deposition/flow of BPSG 680, contact, metalization of aluminum 690, and passivation are carried out to complete the manufacture of the DRAM capacitor.

As can be seen in FIG. 4k, the additional surface areas of bottom plate 661 attained with the present invention lead to a corresponding increase of the dielectric film's area. Hence, the capacitor has a larger capacitance than conventionally made capacitors.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. A method for manufacturing a DRAM capacitor, said method being performed on a substrate having a field oxide and a transistor including a gate electrode and source/drain areas formed thereon, said method comprising the steps of:

depositing an insulator over the gate electrode and the source/drain areas;

depositing a first barrier layer over the insulator;

sequentially depositing a first conductive layer and a second barrier layer over the previously applied first barrier layer;

etching away portions of the insulator, the first barrier layer, the first conductive layer and the second barrier layer overlying the source/drain areas and spaced from the field oxide to form trenches extending to the source/drain areas;

patterning a first layer of resist on the second barrier layer to define a region of the first conductive layer that is to be retained;

thereafter etching away portions of the second barrier layer and the first conductive layer not covered by the resist layer;

removing the first layer of resist so that a top surface remains;

depositing a layer of polysilicon over the top surface, doping an n-type dopant into said polysilicon layer and diffusing said dopant into said substrate to form $n^+$-type diffused regions;

patterning a second layer of resist on said polysilicon layer to define a portion of the polysilicon layer that is to be retained;

etching the polysilicon layer not covered by the second layer of resist to form a second conductive layer;

isotropically etching away said first and second barrier layers so that said first conductive layer, said second conductive layer and said poly spacers are shorted together and thereby form a bottom plate of the DRAM capacitor having a bottom plate surface;

depositing a dielectric film on the bottom plate surface;

depositing a third conductive layer on the bottom plate surface;

patterning a third layer of resist over a portion of the third conductive layer; and etching away a portion of the third conductive layer not covered by the third layer of resist to thereby form a top plate of the DRAM capacitor.

2. A method for manufacturing a DRAM capacitor as claimed in claim 1 wherein the steps of etching away the first barrier layer and the second barrier layer comprise wet etching.

3. A method for manufacturing a DRAM capacitor as claimed in claim 1 wherein the step of etching away to form the trenches comprises dry etching.

4. A method for manufacturing a DRAM capacitor as claimed in claim 1 wherein said insulator is an oxide, said first barrier layer and said second barrier layer are nitrides, and said first conductive layer, said second conductive layer and said third conductive layer are polysilicon.

5. A method for manufacturing a DRAM capacitor as claimed in claim 1 wherein said dielectric film comprises an oxide layer and a nitride layer.

6. A method for manufacturing a DRAM capacitor as claimed in claim 1 wherein said dielectric film sequentially comprises a first oxide layer, a nitride layer and a second oxide layer.

7. A method for manufacturing a DRAM capacitor as claimed in claim 1 wherein the step of etching the polysilicon layer comprises forming spaced-apart poly fins and poly spacers.

8. A method for manufacturing a DRAM capacitor as claimed in claim 7 wherein the step of forming the spaced-apart poly fins and poly spacers comprises plasma etching.

9. A method for manufacturing a DRAM capacitor as claimed in claim 7, including the step of shortening the first conductive layer, the poly fins and the poly spacers.

10. A method for manufacturing a DRAM capacitor on a substrate having a field oxide and a transistor including a gate electrode and source/drain areas formed thereon, the method comprising the steps of:

depositing on the substrate an insulator over the gate electrode and source/drain areas;

depositing a first barrier layer over the insulator;

sequentially depositing a first conductive layer and a second barrier layer over the first barrier layer;

removing portions of the insulator, the first barrier layer, the first conductive layer and the second barrier layer above the source/drain areas and forming trenches reaching the source/drain areas adjacent the field oxide;

patterning a first layer of resist on the second barrier layer;

etching away portions of the second barrier layer and the first conductive layer not covered by the first resist layer;

removing what remains of the first layer of resist to define a top surface;

depositing a conductive material layer over the top surface, doping an n-type dopant into said conductive material layer, diffusing said dopant into said substrate to form $n^+$-type diffused regions, and shaping the conductive material layer to form spaced-apart poly spacers and poly fins;

etching away the first barrier layer and said second barrier layer to thereby form a bottom plate of the DRAM capacitor having a bottom plate surface and defined by the first conductive layer, the poly spacers, and the poly fins;

depositing a dielectric film on the bottom plate surface;

depositing another conductive layer over the dielectric film;

patterning a second layer of resist over a portion of the another conductive layer; and etching away a portion of the another conductive layer not covered by the second layer of resist so that the another conductive layer forms a top plate of the DRAM capacitor.

11. A method for manufacturing a DRAM capacitor on a substrate having a field oxide and a transistor including a gate electrode and source/drain areas formed thereon, the method comprising the steps of:

depositing on the substrate a layer stack comprising an insulator, a first barrier layer, a first conductive layer, and a second barrier layer over the gate electrode and source/drain areas;

removing portions of the layer stack above the source/drain areas and forming trenches reaching the source/drain areas adjacent the field oxide;

etching away portions of the second barrier layer and the first conductive layer;

depositing a conductive material layer over what remains of the layer stack, doping an n-type dopant into the conductive material layer, diffusing the dopant into the substrate to form $n^+$-type diffused regions, and shaping the conductive material layer to form spaced-apart poly spacers and poly fins;

removing the first barrier layer and the second barrier layer to thereby form a bottom plate of the DRAM capacitor having a bottom plate surface and defined by the first conductive layer, the poly spacers, and the poly fins;

depositing a dielectric film on the bottom plate surface; and depositing another conductive layer over the dielectric film so that the another conductive layer forms a top plate of the DRAM capacitor.

* * * * *